US012593596B2

(12) United States Patent
Li

(10) Patent No.: US 12,593,596 B2
(45) Date of Patent: Mar. 31, 2026

(54) DISPLAY PANEL INCLUDING AN ORGANIC TRANSPARENT CONDUCTIVE MATERIAL AND DISPLAY DEVICE HAVING THE SAME

(71) Applicant: Shenzhen China Star Optoelectronics Semiconductor Display Technology Co., Ltd., Shenzhen (CN)

(72) Inventor: Linshuang Li, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 1218 days.

(21) Appl. No.: 17/600,352

(22) PCT Filed: Aug. 27, 2021

(86) PCT No.: PCT/CN2021/114929
§ 371 (c)(1),
(2) Date: Feb. 23, 2023

(87) PCT Pub. No.: WO2023/019627
PCT Pub. Date: Feb. 23, 2023

(65) Prior Publication Data
US 2024/0122035 A1    Apr. 11, 2024

(30) Foreign Application Priority Data
Aug. 17, 2021    (CN) .......................... 202110946026.5

(51) Int. Cl.
*H10K 59/80*      (2023.01)
*H10K 59/124*     (2023.01)
*G02F 1/1368*     (2006.01)

*H10K 102/00*     (2023.01)
*H10K 102/10*     (2023.01)

(52) U.S. Cl.
CPC ..... *H10K 59/80524* (2023.02); *H10K 59/124* (2023.02); *H10K 59/80517* (2023.02); *G02F 1/1368* (2013.01); *H10K 2102/101* (2023.02); *H10K 2102/331* (2023.02)

(58) Field of Classification Search
CPC ........... H10K 59/80524; H10K 59/124; H10K 59/80517; H10K 2102/101; H10K 2102/331; G02F 1/1368
USPC ......................................... 257/72
See application file for complete search history.

(56) References Cited

U.S. PATENT DOCUMENTS 11,114,506 B2 * 9/2021 Zhang ................ H10K 85/1135

FOREIGN PATENT DOCUMENTS

CN          101698746          4/2010
CN          103728757          4/2014
CN          104205250          12/2014
(Continued)

*Primary Examiner* — Phuc T Dang

(57) ABSTRACT

A display panel and a display device are provided. The display panel includes an array substrate and a plurality of first transparent electrodes disposed on the array substrate, and a material of the first transparent electrode is an organic transparent conductive material. The display panel and the display device in the present disclosure can overcome problems that an indium tin oxide transparent electrode in a conventional flexible display device is easily broken and is easily separated from an alignment layer, thereby effectively improving the bending resistance and the stability of a flexible display panel.

16 Claims, 2 Drawing Sheets

10

13

(56)            References Cited

FOREIGN PATENT DOCUMENTS

| | | | | |
|---|---|---|---|---|
| CN | 105070737 | | 11/2015 | |
| CN | 105974685 | | 9/2016 | |
| CN | 106125406 | | 11/2016 | |
| CN | 106784378 | | 5/2017 | |
| CN | 108733252 | | 11/2018 | |
| CN | 109508116 | | 3/2019 | |
| CN | 210467891 U | * | 5/2020 | .......... H10K 59/878 |
| JP | 2007-128946 | | 5/2007 | |
| JP | 2018-081133 | | 5/2018 | |
| KR | 20170113233 A | * | 10/2017 | .......... H01L 51/441 |
| WO | WO-2014162448 A1 | * | 10/2014 | .......... H10K 59/179 |

* cited by examiner

100a

10

100b

100c

DISPLAY PANEL INCLUDING AN ORGANIC TRANSPARENT CONDUCTIVE MATERIAL AND DISPLAY DEVICE HAVING THE SAME

RELATED APPLICATIONS

This application is a National Phase of PCT Patent Application No. PCT/CN2021/114929 having International filing date of Aug. 27, 2021, which claims the benefit of priority of Chinese Patent Application No. 202110946026.5 filed on Aug. 17, 2021. The contents of the above applications are all incorporated by reference as if fully set forth herein in their entirety.

FIELD AND BACKGROUND OF THE INVENTION

The present disclosure relates to the field of display technologies, and specifically, to a display panel and a display device.

Compared with a flexible organic light emitting diode (OLED) display panel, a flexible liquid crystal display (LCD) panel has longer product life and a lower production cost. Therefore, flexible LCD display becomes a research focus and a development direction in the future.

In conventional technologies, a pixel electrode is generally made of an indium tin oxide (ITO) material, but an inorganic ITO film layer is easily broken during bending and crimping, and easily falls off or is even separated from an alignment layer, seriously affecting stability of a device.

During a research and practice of the conventional technologies, the inventor of the present disclosure invents a display panel and a display device, to resolve the above technical problems.

SUMMARY OF THE INVENTION

Embodiments of the present disclosure provide a display panel and a display device, which can alleviate a problem that an indium tin oxide (ITO) transparent electrode in a conventional flexible display device is easily broken, and can improve the bending resistance and the stability of the display panel.

The present disclosure provides a display panel, including:

an array substrate; and a plurality of first transparent electrodes, disposed on the array substrate, wherein a material of the first transparent electrode is an organic transparent conductive material;

the first transparent electrodes are pixel electrodes and/or common electrodes disposed on the array substrate; and the organic transparent conductive material includes polyimide and a nano conductive particle, and the nano conductive particle includes at least one of a nano metal oxide particle or a nano metal particle.

Optionally, in some embodiments, the first transparent electrodes are the pixel electrodes and/or the common electrodes disposed on the array substrate.

Optionally, in some embodiments, the array substrate includes:

a substrate;

a thin film transistor layer, disposed on the substrate;

a planarization layer, disposed on a side of the thin film transistor layer away from the substrate; and an insulating layer, disposed on a side of the planarization layer away from the thin film transistor layer, wherein the common electrodes on the array substrate are disposed between the planarization layer and the insulating layer, and the pixel electrodes on the array substrate are disposed on a side of the insulating layer away from the planarization layer.

Optionally, in some embodiments, the display panel further includes an opposite substrate disposed in alignment with the array substrate; and a plurality of second transparent electrodes are disposed on the opposite substrate, and a material of the second transparent electrode is an organic transparent conductive material.

Optionally, in some embodiments, the first transparent electrodes are the pixel electrodes disposed on the array substrate; and the second transparent electrodes are common electrodes disposed on the opposite substrate.

Optionally, in some embodiments, the first transparent electrodes are disposed on a side of the array substrate facing toward the opposite substrate; and the second transparent electrodes are disposed on a side of the opposite substrate facing toward the array substrate.

Optionally, in some embodiments, the display panel further includes:

a first alignment layer, disposed on the array substrate, and located on a side of the first transparent electrodes facing toward the opposite substrate; and a second alignment layer, disposed on the opposite substrate, and located on a side of the second transparent electrodes facing toward the array substrate.

Optionally, in some embodiments, the display panel includes a plurality of light-emitting devices disposed on the array substrate, and the light-emitting devices include a plurality of anode and a plurality of cathode; and the first transparent electrodes are the anodes and/or the cathodes.

Optionally, in some embodiments, the organic transparent conductive material of the second transparent electrode includes polyimide and a nano conductive particle, and the nano conductive particle includes at least one of a nano metal oxide particle or a nano metal particle.

Correspondingly, the present disclosure further provides a display panel, including:

an array substrate; and a plurality of first transparent electrodes, disposed on the array substrate, wherein a material of the first transparent electrode is an organic transparent conductive material.

Optionally, in some embodiments, the first transparent electrodes are pixel electrodes and/or common electrodes disposed on the array substrate.

Optionally, in some embodiments, the array substrate includes:

a substrate;

a thin film transistor layer, disposed on the substrate;

a planarization layer, disposed on a side of the thin film transistor layer away from the substrate; and an insulating layer, disposed on a side of the planarization layer away from the thin film transistor layer; and the common electrodes on the array substrate are disposed between the planarization layer and the insulating layer, and the pixel electrodes on the array substrate are disposed on a side of the insulating layer away from the planarization layer.

Optionally, in some embodiments, the display panel further includes an opposite substrate disposed opposite to the array substrate; and

a plurality of second transparent electrodes are disposed on the opposite substrate, and a material of the second transparent electrode is an organic transparent conductive material.

Optionally, in some embodiments, the first transparent electrodes are the pixel electrodes disposed on the array substrate; and the second transparent electrodes are common electrodes disposed on the opposite substrate.

Optionally, in some embodiments, the first transparent electrodes are disposed on a side of the array substrate facing toward the opposite substrate; and the second transparent electrodes are disposed on a side of the opposite substrate facing toward the array substrate.

Optionally, in some embodiments, the display panel further includes:

a first alignment layer, disposed on the array substrate, and located on a side of the first transparent electrodes facing toward the opposite substrate; and a second alignment layer, disposed on the opposite substrate, and located on a side of the second transparent electrodes facing toward the array substrate.

Optionally, in some embodiments, the display panel includes a plurality of light-emitting devices disposed on the array substrate, and the light-emitting devices include a plurality of anodes and a plurality of cathodes; and the first transparent electrodes are the anodes and/or the cathodes.

Optionally, in some embodiments, the organic transparent conductive material includes polyimide and a nano conductive particle, and the nano conductive particle includes at least one of a nano metal oxide particle or a nano metal particle.

Correspondingly, the present disclosure further provides a display device, the display device includes a display panel of the present disclosure, and the display panel includes:

an array substrate; and a plurality of first transparent electrodes, disposed on the array substrate, wherein a material of the first transparent electrode is an organic transparent conductive material.

The display panel and the display device in the embodiments of the present disclosure replace an ITO transparent electrode in a conventional display panel by using a first transparent electrode made of an organic transparent conductive material, which can resolve problems that the conventional ITO transparent electrode is easily broken and is easily separated from an alignment layer, and can effectively improve the stability and the bending resistance of the display panel.

4

DESCRIPTION OF SPECIFIC EMBODIMENTS OF THE INVENTION

The present disclosure provides a display panel and a display device, and to make the objectives, technical solutions, and effects of the present disclosure clearer and more comprehensible, the following further describes the present disclosure in detail with reference to the accompanying drawings and embodiments. It should be understood that the specific embodiments described herein are merely used to explain the present disclosure but are not intended to limit the present disclosure.

The embodiments of the present disclosure provide a display panel and a display device. Detailed descriptions are separately performed below. The description sequence of the following embodiments is not intended to limit preference orders of the embodiments.

Figure 1:
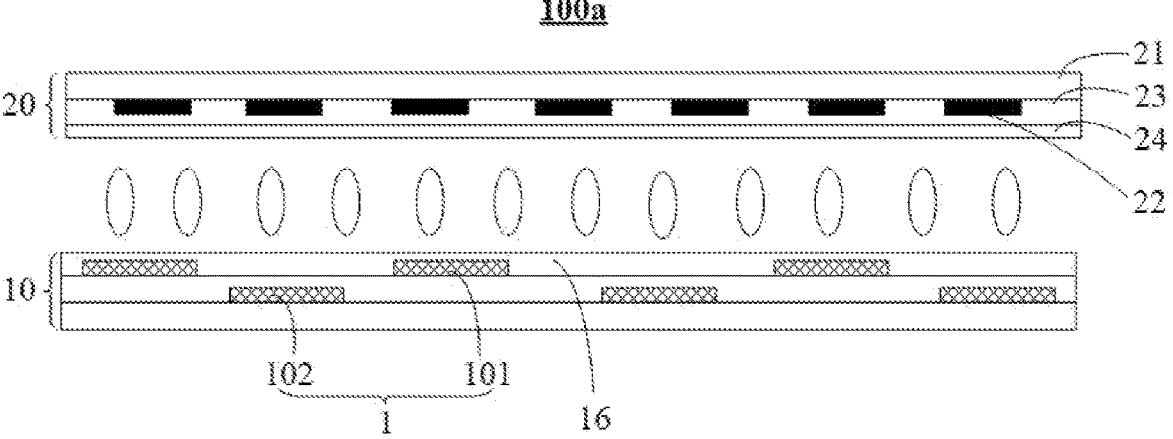
FIG. 1 is a schematic diagram of a structure of a first embodiment of a display panel according to an embodiment of the present disclosure.
Figure 2:
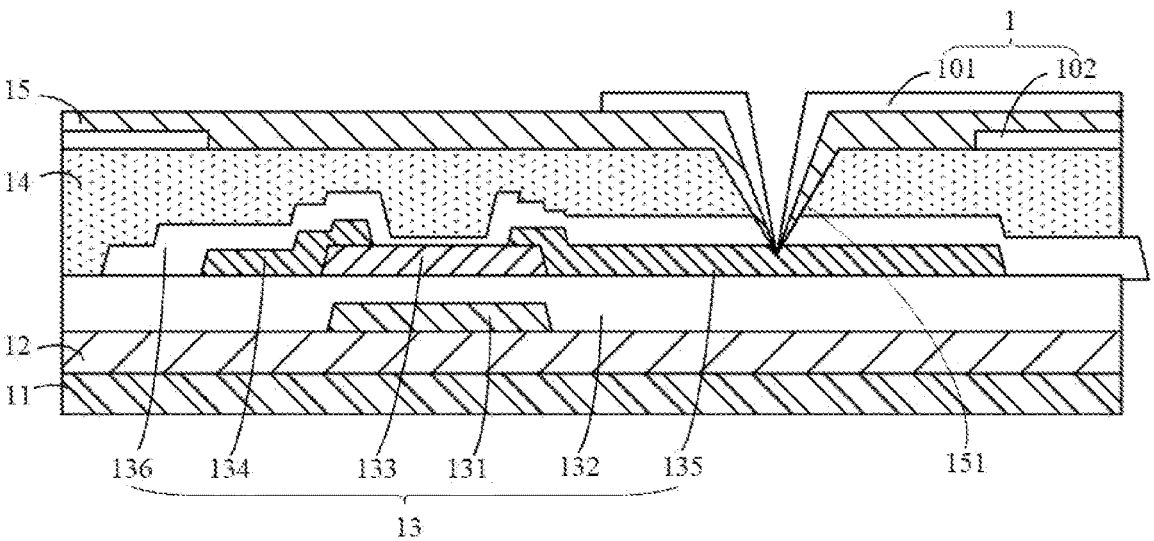
FIG. 2 is a schematic diagram of a structure of an array substrate in FIG. 1.

As shown in FIG. 1 and FIG. 2, the embodiments of the present disclosure provide a display panel, and the display panel 100 includes an array substrate 10 and a plurality of first transparent electrodes 1 disposed on the array substrate 10. A material of the first transparent electrode 1 is an organic transparent conductive material.

Compared with a conventional inorganic indium tin oxide (ITO) material, the organic transparent conductive material in the present disclosure, as an organic light-transmitting material, has significantly better bending resistance and flexibility in addition to ultra-high transparency. That is, bending resistance, flexibility, and transparency of the first transparent electrode 1 in the present disclosure are significantly better than that of a conventional inorganic ITO transparent electrode.

In the solution of the present disclosure, the ITO transparent electrode in the display panel is replaced with the first transparent electrode 1, which overcomes a problem that the conventional ITO electrode is easily broken and a problem of separation of film layers related to the ITO electrode due to the breakage of the ITO electrode, and can improve the bending resistance and the stability of the display panel 100 of the present disclosure.

As a preferred implementation, the organic transparent conductive material includes polyimide and a nano conductive particle, and a material of the nano conductive particle includes at least one of a nano metal oxide or a nano metal.

The nano metal may be, but is not limited to, silver, copper, or nickel. The nano metal oxide may be, but is not limited to, zinc oxide, titanium oxide, aluminium-doped zinc oxide, or indium-doped oxide. In a preferred embodiment, the nano conductive particle is made of silver.

A type of the display panel 100 is not limited in the present disclosure, and may be a liquid crystal display (LCD), an organic light-emitting diode (OLED), or a quantum dot light emitting diodes (QLED) display panel.

When the display panel 100 is an LCD panel, a display mode of the display panel 100 may be a vertical alignment (VA) mode, an in plane switching (IPS) mode, or a fringe field switching (FFS) mode.

Specifically, the first transparent electrode may be specifically configured according to the type of the display panel 100. When the display panel 100 is an OLED display panel or a QLED display panel, the first transparent electrodes 1 are configured as at least one of cathodes or anodes. When the display panel 100 is the LCD panel, the first transparent electrodes 1 may be configured as pixel electrodes and/or common electrodes disposed on the array substrate 10.

Figure 3:
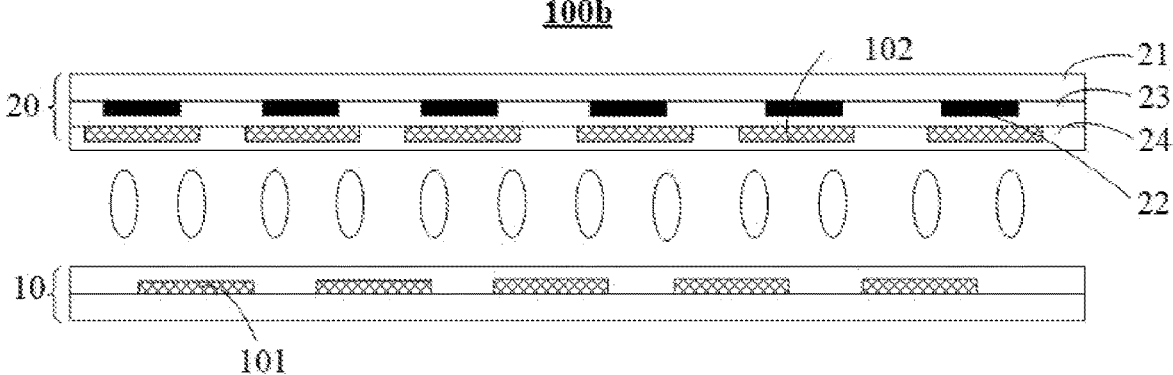
FIG. 3 is a schematic diagram of a structure of a second embodiment of a display panel according to an embodiment of the present disclosure.
Figure 4:
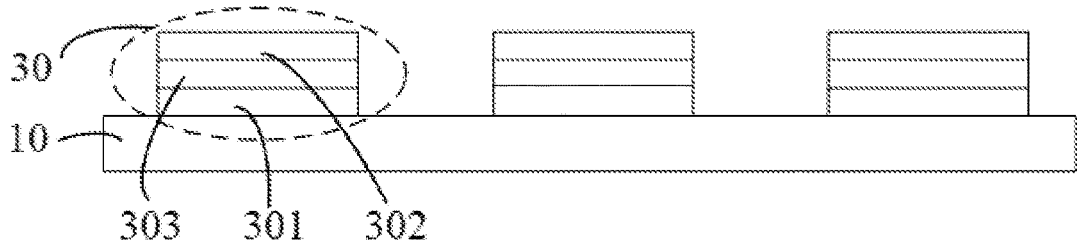
FIG. 4 is a schematic diagram of a structure of a third embodiment of a display panel according to an embodiment of the present disclosure.

Referring to FIG. 1 to FIG. 4, the present disclosure provides three implementations of the display panel 100, wherein display panels 100*a* and 100*b* in FIG. 1 and FIG. 3 are the LCD panels, and a display panel 100*c* in FIG. 4 is the OLED display panel.

The LCD panels 100*a* and 100*b* in FIG. 1 and FIG. 3 include a plurality of pixel electrodes 101 and a plurality of common electrodes 102. In the display panels 100*a* and 100*b*, the pixel electrodes 101 and the common electrodes 102 are arranged according to display modes of the display panels 100*a* and 100*b*. For example, in a VA mode, the pixel electrodes 101 and the common electrodes 102 are respectively disposed on the array substrate 10 and an opposite substrate 20. While in an IPS mode or an FFS mode, the pixel electrodes 101 and the common electrodes 102 are disposed on the array substrate 10 simultaneously. In the present disclosure, the display mode of the display panel 100*a* is the FFS mode, while the display mode of the display panel 100*b* is the VA mode.

FIG. 1 and FIG. 3 are further compared, in the display panel 100*a* in FIG. 1, the first transparent electrodes 1 are the pixel electrodes 101 and the common electrodes 102 disposed on the array substrate 10. While in the display panel 100*b* in FIG. 3, the first transparent electrodes 1 are the pixel electrodes 101 disposed on the array substrate 10, and the common electrodes 102 disposed on the opposite substrate 20.

The display panel 100*c* in FIG. 4 includes a plurality of light-emitting devices 30, the light-emitting devices 30 include a plurality of anodes 301 and a plurality of cathodes 302, and the first transparent electrodes 1 are configured as the anodes 301 and/or the cathodes 302.

Implementations of the display panel 100*a* and the first transparent electrode 1 provided in the embodiments of the present disclosure are described below in detail with reference to FIG. 1 and FIG. 2.

Referring to FIG. 1, the display panel 100*a* includes the array substrate 10 and the opposite substrate 20 that are disposed in alignment, and a liquid crystal layer sealed between the array substrate 10 and the opposite substrate 20.

Referring to FIG. 1, both the pixel electrodes 101 and the common electrodes 102 of the display panel 100*a* are arranged on the array substrate 10, and the pixel electrodes 101 and the common electrodes 102 are not disposed on the opposite substrate 20. Correspondingly, some first transparent electrodes 1 are configured as the pixel electrodes 101, and some other first transparent electrodes 1 are configured as the common electrodes 102.

Referring to FIG. 2, the array substrate 10 further includes a first substrate 11, a buffer layer 12, a thin film transistor 13, a planarization layer 14 and an insulating layer 15.

The first substrate 11 is made of a polymer-based material having transparency and flexibility. For example, the first substrate 11 may include polyimide, polysiloxane, epoxylite, acrylic-based resin, polyester, and/or a similar material. In a preferred embodiment, the first substrate 11 may include polyimide.

Referring to FIG. 2, the buffer layer 12 is disposed on the first substrate 11, and the buffer layer 12 is a stacked structure including a plurality of sublayers. A material of each sublayer is respectively and independently at least one of SINx or SIOx. Certainly, in other embodiments, the buffer layer 12 may be alternatively a single-layer film layer structure. A structure of the buffer layer 12 is not limited in the present disclosure.

As shown in FIG. 2, the thin film transistor 13 is disposed on a side of the buffer layer 12 away from the first substrate

11. The thin film transistor 13 includes a gate 131, a gate insulating layer 132, an active layer 133, a source 134, a drain 135, and a passivation layer 136.

As shown in FIG. 2, the gate 131 is disposed on the side of the buffer layer 12 away from the first substrate 11; the gate insulating layer 132 is disposed on the gate 131 and covers the gate 131 and the buffer layer 12; the active layer 133 is disposed on a side of the gate insulating layer 132 away from the buffer layer 12, and an orthographic projection of the active layer 133 on the buffer layer 12 falls in an orthographic projection of the gate 131 on the first substrate 11; both the source 134 and the drain 135 are disposed on the active layer 133, and are respectively located in two opposite edge regions of the active layer 133; and the passivation layer 136 is disposed on the source 134 and the drain 135 and covers the source 134, the drain 135, the active layer 133, and the gate insulating layer 132.

The gate 131 can be reused as a light shielding layer, and configured to shield light emitted from a side of the first substrate 11 away from the buffer layer 12, to protect the active layer 133. During specific implementation, the gate 131, the source 134, and the drain 135 may include a metal, an alloy, or a metal nitride. For example, the gate 131 may include metals, such as aluminum (Al), silver (Ag), wolfram (W), copper (Cu), nickel (Ni), chromium (Cr), molybdenum (Mo), titanium (Ti), platinum (Pt), tantalum (Ta), and neodymium (Nd), and alloys and/or nitrides thereof.

During specific implementation, the active layer 133 may include a silicon compound, such as polysilicon. In some embodiments, a source region and a drain region including P-type or N-type impurities may be formed on two ends of the active layer 133. In some embodiments, the active layer 133 may include an oxide semiconductor, such as indium gallium zinc oxide (IGZO), zinc tin oxide (ZTO), indium tin zinc oxide (ITZO), and/or a similar material.

During specific implementation, a material of the passivation layer 136 may include an organic material, such as polyimide, epoxylite, acrylic-based resin, polyester, and/or a similar material.

It should be noted that, FIG. 2 is merely a schematic diagram of a structure of a thin film transistor 13 of a bottom gate type. During specific implementation, the thin film transistor 13 may be alternatively a thin film transistor of another structure or type of. For example, the thin film transistor (TFT) 13 may be alternatively an indium gallium zinc oxide (IGZO) TFT of a top gate type, an indium gallium zinc ti oxide (IGZTO) TFT of a bottom gate type, or an IGZO TFT of a back channel etched (BCE) type.

Specifically, the thin film transistor 13 further includes a plurality of traces. Specifically, the traces include, but are not limited to, a data line DL, a gate line GL, and a common voltage supply line. Data voltage of the data line DL may be supplied to the pixel electrode 101 through gate pulse of the gate line GL, and the common voltage supply line can apply common voltage to the common electrode 102.

As shown in FIG. 2, the planarization layer 14 is disposed on the thin film transistor 13, and the planarization layer 14 covers the thin film transistor 13 and the buffer layer 12.

In the solution of the present disclosure, on one hand, the planarization layer 14 may be configured to protect the thin film transistor 13. On the other hand, because the thin film transistor 13 has a complex layer structure, it is possible that a top surface of the thin film transistor is uneven. A side of the planarization layer 14 away from the thin film transistor 13 is provided with a basically flat or flat top surface, so that the surface of the thin film transistor 13 is planarized, thereby helping subsequent preparation of film layers.

After the planarization layer 14 is formed, a contact hole or a through hole passing through the planarization layer 14 may be formed in the planarization layer 14, to expose a source electrode or a drain electrode of the thin film transistor 13.

During specific implementation, the planarization layer 14 may be a single layer or a multilayer made of an organic material and/or an inorganic material.

Specifically, the array substrate 10 is an array of a color filter on array (COA) type, that is, a color photoresist layer or a color film layer is disposed on the array substrate 10. That is, the array substrate 10 may further include a color photoresist layer.

The color photoresist layer includes a plurality of color photoresist blocks disposed at intervals. The color photoresist blocks are configured to convert incident light of light into exiting light of various colors, so as to visually display a color corresponding to a color filter, and then display a required picture. Preferably, the color photoresist blocks include at least one of a red color photoresist block, a blue color photoresist block, or a green color photoresist block.

Specifically, the color photoresist layer may be disposed between the thin film transistor 13 and the planarization layer 14. For more detail, the color photoresist layer is disposed between the passivation layer 136 and the planarization layer 14. In this case, uneven topographical junctions of the color photoresist layer may also be planarized by the planarization layer 14.

Still referring to FIG. 2, the common electrodes 102 are disposed on the planarization layer 14.

As mentioned above, some first transparent electrodes 1 are configured as the common electrodes 102. In other words, a material of the common electrode 102 may be the organic transparent conductive material. For specific content of the organic transparent conductive material, reference is made to the foregoing description, and details are not described herein again.

In this way, the common electrode made of the organic transparent conductive material can improve the flexibility and the bending resistance of the common electrode 102, and prevent the common electrode 102 from being broken during bending or crimping, thereby improving the bending resistance and the stability of the flexible display panel.

Specifically, the common electrode 102 may be implemented in a form of a plate electrode, a slit electrode, or a finger electrode. It should be noted that, an arrangement form of the common electrode 102 is not limited in the present disclosure.

Still referring to FIG. 2, the insulating layer 15 is disposed on the common electrodes 102 and covers the common electrodes 102 and the planarization layer. The insulating layer is configured to maintain electrical insulation between the pixel electrodes and the common electrodes.

Specifically, the insulating layer 15 may be the passivation layer or an interlayer dielectric layer. During specific implementation, the insulating layer may include an organic material, such as polyimide, epoxylite, acrylic-based resin, polyester, and/or a similar material.

Still referring to FIG. 2, the pixel electrodes 101 are disposed on a side of the insulating layer 15 away from the common electrode 102. The pixel electrodes 101 cooperates with the common electrodes 102, and an electric field for controlling deflection of liquid crystal molecules may be formed between the pixel electrodes and the common electrodes.

As mentioned above, the pixel electrodes 101 may be the first transparent electrodes 1 of the present disclosure, that is, a material of the pixel electrode 101 is the organic transparent conductive material. For specific content of the organic transparent conductive material, reference is made to the foregoing description, and details are not described herein again.

Similarly, a conventional ITO transparent material is replaced with the organic transparent conductive material, which improves the flexibility and the bending resistance of the pixel electrode 101, and can prevent the pixel electrode 101 from being broken during bending or crimping, thereby improving the bending resistance and the stability of the display panel.

Referring to FIG. 1, the pixel electrodes 101 are electrically connected to the drain of the thin film transistor 13 through a first through hole 151, and receives the data voltage on the data line DL applied by the TFT.

In the present embodiment, the first through hole 151 successively passes through the insulating layer 15, the planarization layer 14, and the passivation layer 136, and exposes the drain 135 of the thin film transistor 13.

Specifically, the pixel electrodes 101 may be filled in the first through hole 151, or form a corresponding sunken structure in the first through hole 151. Whichever disposing manner is used, some pixel electrodes 101 are embedded into the first through hole 151.

On one hand, such arrangement increases a good bonding force between the pixel electrode 101 and the insulating layer 15, and improves adhesion of the pixel electrode 101, thereby preventing stripping of the pixel electrode 101. On the other hand, because the material of the pixel electrode 101 is the organic transparent conductive material, that the pixel electrode 101 is embedded into the first through hole 151 is essentially that the organic material is embedded into the first through hole 151, so as to effectively disperse stress when the display panel 100 is impacted or bent.

Preferably, orthographic projections of the pixel electrodes 101 on the display panel 100 cover orthographic projections of the common electrodes 102 on the display panel 100. In this case, the pixel electrodes 101 and the common electrodes 102 are overlappedly arranged, and can be matched to constitute a storage capacitor. Further, the pixel electrodes 101 and the common electrodes 102 are respectively reused as electrodes of the storage capacitor.

Specifically, the pixel electrode 101 may be implemented in a form of a plate electrode, a slit electrode, or a finger electrode.

Still referring to FIG. 1 and FIG. 2, the display panel 100*a* further includes a first alignment layer 16, and the first alignment layer 16 is disposed on the array substrate 10. In the present embodiment, the first alignment layer 16 is disposed on the pixel electrodes 101.

In addition, it should be further noted that, by using the first transparent electrode 1, the problem of the separation of the film layers related to the ITO electrode due to the breakage of the ITO electrode may further be resolved. For example, breakage of a conventional ITO pixel electrode may easily cause a problem of separation of alignment layers, while the first transparent electrode 1 of the present disclosure can resolve this problem, and then improve the bending resistance and the stability of the display panel.

Still referring to FIG. 1, the opposite substrate 20 includes a second substrate 21, a black matrix 22, a planarization layer 23, and a second alignment layer 24. The second substrate 21 is disposed on the black matrix 22, and the planarization layer 23 is disposed on the black matrix 22 and covers the black matrix 22 and the second substrate 21.

Compared with the display panel 100*a* in FIG. 1, the biggest distinguishing feature of the display panel 100*b* in FIG. 3 is that: the common electrodes 102 are arranged on the opposite substrate 20, and the material of the common electrode 102 is the organic transparent conductive material.

The organic transparent conductive material includes polyimide and the nano conductive particle, and a material of the nano conductive particle includes at least one of a nano metal oxide or a nano metal.

The nano metal may be, but is not limited to, silver, copper, or nickel. The nano metal oxide may be, but is not limited to, zinc oxide, titanium oxide, aluminium-doped zinc oxide, or indium-doped oxide. In a preferred embodiment, the nano conductive particle is made of silver.

Compared with the opposite substrate 20 in FIG. 1, the common electrodes 102 are disposed on the planarization layer 23 and the second alignment layer 24 of the opposite substrate 20 in FIG. 3.

Similar to the first transparent electrode 1, the material of the common electrode 102 on the opposite substrate 20 is replaced from the ITO to the organic transparent conductive material, which can resolve the problem of the separation of the film layers related to the ITO electrode due to the breakage of the ITO electrode, and then improve the stability of the flexible display panel.

Because an improvement focus of the present disclosure is not a structure of the array substrate 10, FIG. 3 does not show a detailed film layer structure of the display panel 100*b*. During specific implementation, an array substrate 10 of the display panel 100*b* may be a conventional array substrate, or may be obtained by adaptively adjusting the array substrate 10 of the display panel 100*a*. Therefore, details of a structure of the array substrate 10 of the display panel 100*b* are not described again.

Finally, it should be noted that, FIG. 1 and FIG. 3 are merely schematic implementations of the display panel 100 of the present disclosure. In other implementations of the present disclosure, the pixel electrodes 101 may be respectively arranged on the array substrate 10 and the opposite substrate 20, and the common electrodes 102 may further be respectively arranged on the array substrate 10 and the opposite substrate 20.

An implementation case in which the display panel 100 of the present disclosure is the OLED display panel is described below in detail with reference to the display panel 100*c* in FIG. 4.

Still further, in the solution of the present embodiment, the display panel 100*c* further includes a plurality of light-emitting devices 30 disposed on the array substrate, and the light-emitting devices 30 include a plurality of anodes 301 and a plurality of cathodes 302.

During specific implementation, the light-emitting devices 30 further include a plurality of light-emitting layers 303 disposed between the anodes 301 and the cathodes 302. In the present embodiment, the anodes 301, the light-emitting layers 303, and the cathodes 302 are successively stacked on the array substrate 10.

Specifically, the first transparent electrodes 1 are the anodes 301 and/or the cathodes 302. Still further, the first transparent electrodes 1 may be configured as at least one of the anodes 301 or the cathodes 302 of the light-emitting devices 30 according to a light-emitting need of the display panel 100. For example, when the light-emitting devices 30 are light-emitting devices of a bottom light-emitting type or a double-side light-emitting type, the first transparent electrodes 1 are configured as the anodes 301 of the light-emitting devices 30.

Certainly, in the light-emitting devices of the double-side light-emitting type, to further improve the flexibility and the bending resistance of the display panel 100, the cathode 302 of the light-emitting devices 30 may be alternatively made of the organic transparent conductive material.

Based on the same inventive concept, the present disclosure further provides a display device, and the display device includes a display panel of the present disclosure.

When the display device is an LCD device, the display device further includes a backlight module. The backlight module is disposed on a non-light-emitting side of the display panel, and is configured to provide backlight for an LCD panel.

It may be understood that, for a person of ordinary skill in the art, equivalent replacements and changes may be made to the technical solutions of the present disclosure and the inventive concept thereof, and these changes or equivalent replacements shall fall within the protection scope of the appended claims of the present disclosure.

What is claimed is:

1. A display panel, comprising:
   an array substrate; and
   a plurality of first transparent electrodes, disposed on the array substrate, wherein
   a material of the first transparent electrode is an organic transparent conductive material;
   the first transparent electrodes are pixel electrodes or common electrodes disposed on the array substrate; and
   the organic transparent conductive material comprises polyimide and a nano conductive particle, and the nano conductive particle comprises at least one of a nano metal oxide particle or a nano metal particle.

2. The display panel as claimed in claim 1, wherein the array substrate comprises:
   a substrate;
   a thin film transistor layer, disposed on the substrate;
   a planarization layer, disposed on a side of the thin film transistor layer away from the substrate; and
   an insulating layer, disposed on a side of the planarization layer away from the thin film transistor layer, wherein the common electrodes on the array substrate are disposed between the planarization layer and the insulating layer, and the pixel electrodes on the array substrate are disposed on a side of the insulating layer away from the planarization layer.

3. The display panel as claimed in claim 1, wherein the display panel further comprises an opposite substrate disposed in alignment with the array substrate; and
   a plurality of second transparent electrodes are disposed on the opposite substrate, and a material of the second transparent electrode is an organic transparent conductive material.

4. The display panel as claimed in claim 3, wherein the first transparent electrodes are the pixel electrodes disposed on the array substrate; and
   the second transparent electrodes are common electrodes disposed on the opposite substrate.

5. The display panel as claimed in claim 3, wherein the first transparent electrodes are disposed on a side of the array substrate facing toward the opposite substrate; and
   the second transparent electrodes are disposed on a side of the opposite substrate facing toward the array substrate.

6. The display panel as claimed in claim 3, wherein the display panel further comprises:
   a first alignment layer, disposed on the array substrate, and located on a side of the first transparent electrodes facing toward the opposite substrate; and a second alignment layer, disposed on the opposite substrate, and located on a side of the second transparent electrodes facing toward the array substrate.

7. The display panel as claimed in claim 1, wherein the display panel comprises a plurality of light-emitting devices disposed on the array substrate, and the light-emitting devices comprise a plurality of anodes and a plurality of cathodes; and the first transparent electrodes are the anodes or the cathodes.

8. The display panel as claimed in claim 5, wherein the organic transparent conductive material of the second transparent electrode comprises polyimide and a nano conductive particle, and the nano conductive particle comprises at least one of a nano metal oxide particle or a nano metal particle.

9. A display panel, comprising:

an array substrate; and a plurality of first transparent electrodes, disposed on the array substrate, wherein a material of the first transparent electrode is an organic transparent conductive material;

wherein the first transparent electrodes are disposed on the array substrate and serve as one or both of pixel electrodes or common electrodes;

wherein the array substrate comprises:

a substrate;

a thin film transistor layer, disposed on the substrate;

a planarization layer, disposed on a side of the thin film transistor layer away from the substrate; and an insulating layer, disposed on a side of the planarization layer away from the thin film transistor layer, wherein the common electrodes on the array substrate are disposed between the planarization layer and the insulating layer, and the pixel electrodes on the array substrate are disposed on a side of the insulating layer away from the planarization layer.

10. The display panel as claimed in claim 9, wherein the display panel further comprises an opposite substrate disposed in alignment with the array substrate; and a plurality of second transparent electrodes are disposed on the opposite substrate, and a material of the second transparent electrode is an organic transparent conductive material.

11. The display panel as claimed in claim 10, wherein the first transparent electrodes are the pixel electrodes disposed on the array substrate; and the second transparent electrodes are common electrodes disposed on the opposite substrate.

12. The display panel as claimed in claim 10, wherein the first transparent electrodes are disposed on a side of the array substrate facing toward the opposite substrate; and the second transparent electrodes are disposed on a side of the opposite substrate facing toward the array substrate.

13. The display panel as claimed in claim 10, wherein the display panel further comprises:

a first alignment layer, disposed on the array substrate, and located on a side of the first transparent electrodes facing toward the opposite substrate; and a second alignment layer, disposed on the opposite substrate, and located on a side of the second transparent electrodes facing toward the array substrate.

14. The display panel as claimed in claim 9, wherein the display panel comprises a plurality of light-emitting devices disposed on the array substrate, and the light-emitting devices comprise a plurality of anodes and a plurality of cathodes; and the first transparent electrodes are the anodes or the cathodes.

15. The display panel as claimed in claim 9, wherein the organic transparent conductive material comprises polyimide and a nano conductive particle, and the nano conductive particle comprises at least one of a nano metal oxide particle or a nano metal particle.

16. A display device, comprising a display panel, wherein the display panel comprises:

an array substrate; and a plurality of first transparent electrodes, disposed on the array substrate, wherein a material of the first transparent electrode is an organic transparent conductive material, wherein the organic transparent conductive material comprises polyimide and a nano conductive particle, and the nano conductive particle comprises at least one of a nano metal oxide particle or a nano metal particle.

* * * * *